(12) United States Patent
Yen et al.

(10) Patent No.: US 12,176,136 B2
(45) Date of Patent: Dec. 24, 2024

(54) TRANSFORMER DEVICE

(71) Applicant: REALTEK SEMICONDUCTOR CORPORATION, Hsinchu (TW)

(72) Inventors: Hsiao-Tsung Yen, Hsinchu (TW); Jian-You Chen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 690 days.

(21) Appl. No.: 17/313,036

(22) Filed: May 6, 2021

(65) Prior Publication Data
US 2021/0358681 A1    Nov. 18, 2021

(30) Foreign Application Priority Data

May 13, 2020  (TW) ................................ 109115834

(51) Int. Cl.
*H01F 27/28*    (2006.01)
*H01F 27/29*    (2006.01)
*H01F 27/40*    (2006.01)

(52) U.S. Cl.
CPC .............. *H01F 27/29* (2013.01); *H01F 27/40* (2013.01)

(58) Field of Classification Search
CPC ...................................................... H01F 27/29
USPC .................................................. 336/235, 225
See application file for complete search history.

(56) References Cited

U.S. PATENT DOCUMENTS

| 8,198,970 B2 * | 6/2012 | Choi ................... H01F 17/0013 |
| | | 336/200 |
| 10,186,364 B2 | 1/2019 | Yen et al. |
| 10,340,880 B2 | 7/2019 | Yen |
| 2010/0148866 A1 * | 6/2010 | Lee .......................... H03F 3/195 |
| | | 29/605 |
| 2013/0265132 A1 | 10/2013 | Huang et al. |
| 2016/0086725 A1 | 3/2016 | Igarashi |

(Continued)

FOREIGN PATENT DOCUMENTS

CN        106710847 A        5/2017

OTHER PUBLICATIONS

OA letter of the counterpart CN application (appl. No. 202010429772.2) mailed on Dec. 26, 2022. Summary of the OA letter: Claims 1~10 are rejected under Chinese Patent Act §22-2 as being anticipated by D1 (CN106710847A; also published as U.S. Appl. No. 10/340,880).

(Continued)

*Primary Examiner* — Ronald Hinson
(74) *Attorney, Agent, or Firm* — WPAT, P.C.

(57) ABSTRACT

A transformer device includes a first coil, a second coil, and a third coil. The first coil includes a first ring structure, a second ring structure, a first connecting portion, and a first terminal, in which the first terminal is arranged on the first connecting portion and is located at a central location between the first ring structure and the second ring structure, the first terminal is connected to the first ring structure through the first connecting portion in a first direction, and connected to the second ring structure through the first connecting portion in a second direction, and the first direction is the opposite of the second direction. The second coil is configured to couple the first ring structure. The third coil is configured to couple the second ring structure, in which the second coil and the third coil have the same structure.

19 Claims, 7 Drawing Sheets

(56) References Cited

U.S. PATENT DOCUMENTS

2017/0012601 A1* 1/2017 Yen .................... H01L 23/5227
2019/0279809 A1 9/2019 Yen
2019/0392980 A1 12/2019 Yen

OTHER PUBLICATIONS

L. Ye, J. Chen, L. Kong, E. Alon and A. M. Niknejad, "Design Considerations for a Direct Digitally Modulated WLAN Transmitter With Integrated Phase Path and Dynamic Impedance Modulation," in IEEE Journal of Solid-State Circuits, vol. 48, No. 12, pp. 3160-3177, Dec. 2013, doi: 10.1109/JSSC.2013.2281142.
U.S. Appl. No. 17/512,696 OA mailed on Jul. 25, 2024.

* cited by examiner

TRANSFORMER DEVICE

BACKGROUND

1. Technical Field

The present disclosure relates to a transformer device. More particularly, the present disclosure relates to a planar transformer device for power combination.

2. Description of Related Art

Certain integrated circuits (ICs) for radio frequency signals have to convert signals between a common mode and a differential mode. A BALUN is usually utilized in this kind of signal conversion. A BALUN is one of many applications of a transformer, and is implemented with coil(s) in the ICs. Therefore, a good design for coils in terms of excellent coupling, higher quality factor, and improved line balancing becomes more and more significant.

SUMMARY

In some embodiments, a transformer device includes a first coil, a second coil, and a third coil. The first coil includes a first ring structure, a second ring structure, a first connecting portion, and a first terminal, in which the first terminal is arranged on the first connecting portion and is located at a central location between the first ring structure and the second ring structure, the first terminal is connected to the first ring structure through the first connecting portion in a first direction, and connected to the second ring structure through the first connecting portion in a second direction, and the first direction is the opposite of the second direction. The second coil is configured to couple the first ring structure. The third coil is configured to couple the second ring structure, in which the second coil and the third coil have the same structure.

These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, "about" or "substantially" shall generally mean within 20 percent, preferably within 10 percent, and more preferably within 5 percent of a given value or range. Numerical quantities given herein are approximate, meaning that the term "about" or "substantially" can be inferred if not expressly stated.

Further, for ease of description, spatially relative terms, such as "left," "right," "lower," "upper," and the like, may be used herein to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1A:
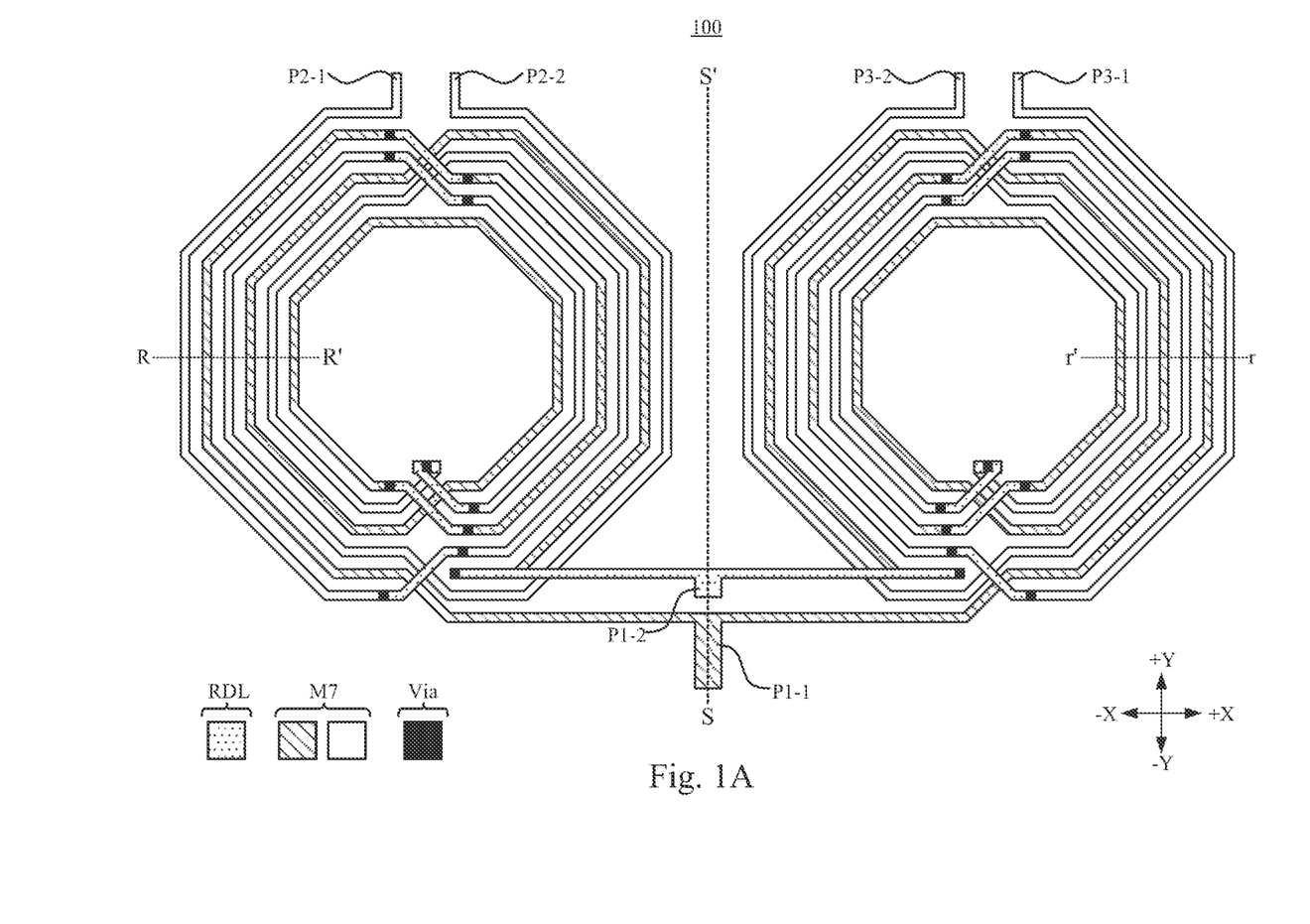
FIG. 1A is a schematic diagram of a transformer device according to some embodiments of the present disclosure.
Figure 1B:
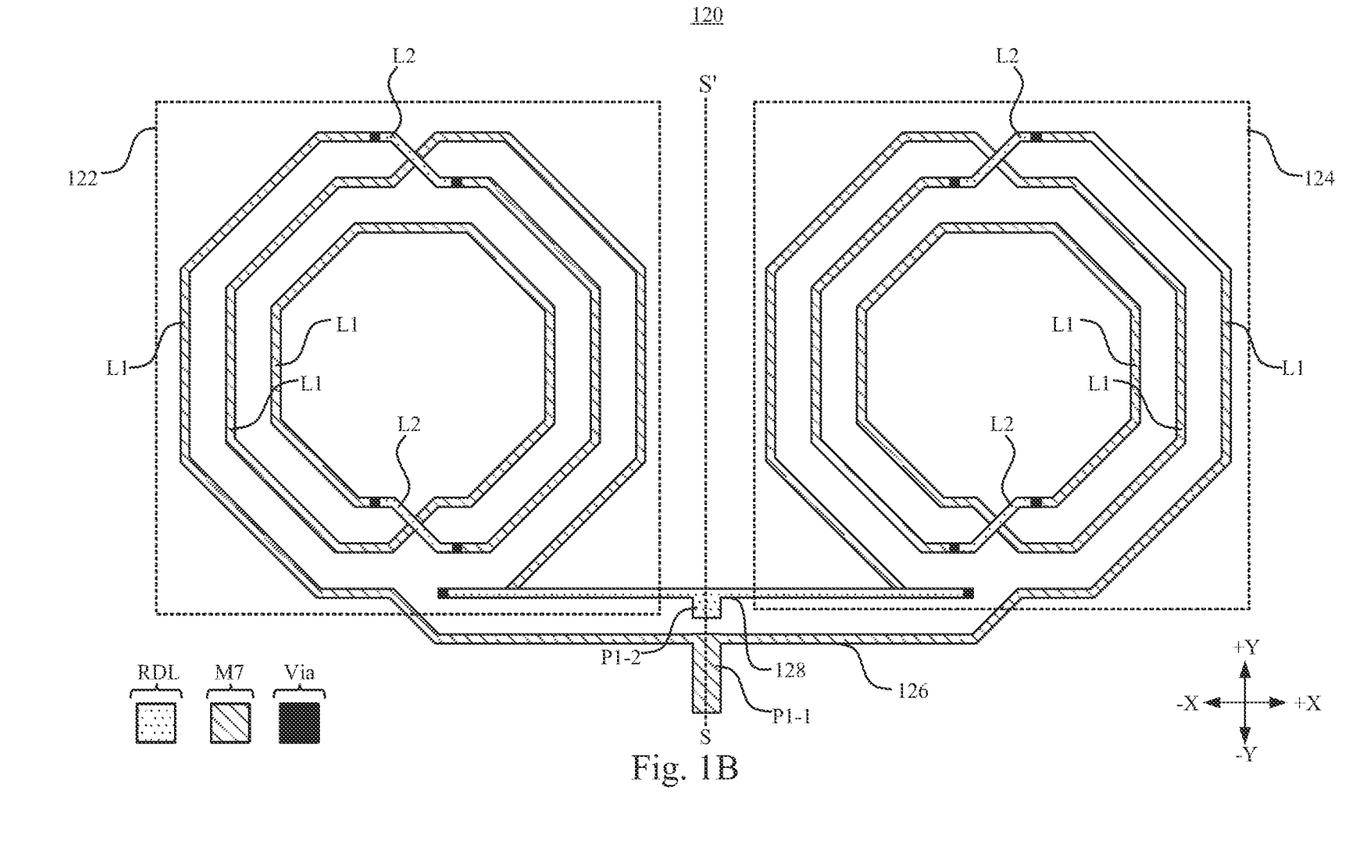
FIG. 1B is a schematic diagram of a schematic diagram of a coil in FIG. 1A according to some embodiments of the present disclosure.
Figure 1C:
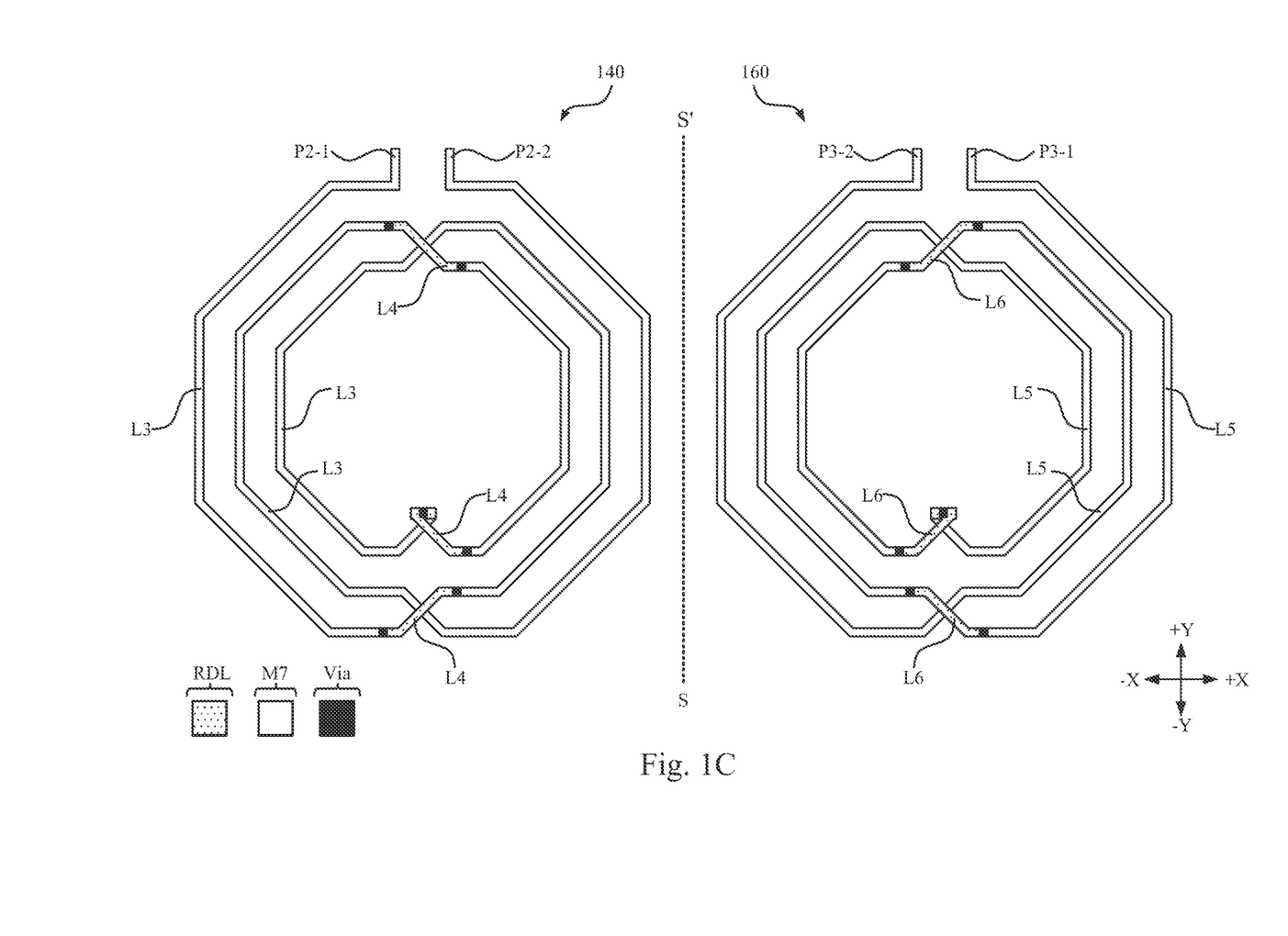
FIG. 1C is a schematic diagram of two coils in FIG. 1A according to some embodiments of the present disclosure.

Reference is made to FIG. 1A to FIG. 1C. FIG. 1A is a schematic diagram of a transformer device 100 according to some embodiments of the present disclosure. FIG. 1B is a schematic diagram of a schematic diagram of a coil 120 in FIG. 1A according to some embodiments of the present disclosure, and FIG. 1C is a schematic diagram of a coil 140 and a coil 160 in FIG. 1A according to some embodiments of the present disclosure. In some embodiments, the transformer device 100 may operate (but not limited to) as a power combiner, which may couple signals from two symmetrical coils to a single coil, in order to output a single signal. For ease of understanding, components in the transformer device 100 are separately shown in FIG. 1B and FIG. 1C. In some embodiments, the transformer device 100 is formed with the coils 120, 140, and 160 shown in FIG. 1B and FIG. 1C.

As shown in FIG. 1B, the coil 120 may be a planar coil. The coil 120 includes a ring structure 122, a ring structure 124, a connecting portion 126, a connecting portion 128, a terminal P1-1, and a terminal P1-2. Each of the ring structure 122 and the ring structure 124 includes conductive segments arranged in a three-turn structure. The ring structure 122 and the ring structure 124 have the same structure. Taking the ring structure 122 as an example, the ring structure 122 includes conductive segments L1 (shown in stripes) and conductive segments L2 (shown in dots). In some embodiments, the conductive segments L1 may be implemented with a metal layer M7, the conductive segments L2 may be implemented with a redistribution layer (RDL), and the metal layer M7 and the redistribution layer RDL are different metal layers. The conductive segments L1 and the conductive segments L2 form crossing structures. At least one via (shown in black) is arranged on each of two terminals of the conductive segment(s) L2, in order to couple the conductive segment L1 to the conductive segment L2. In some embodiments, a reference line S-S' is presented between the ring structure 122 and the ring structure 124, such that the ring structure 122 and the ring structure 124 are substantially mirror images of each other with respect to the reference line S-S'. It is understood that, the reference line S-S' is at a central location between the ring structure 122 and the ring structure 124, and the reference line S-S' is not a physical component in the transformer device 100.

The connecting portion 126 and the connecting portion 128 are configured to connect the ring structure 122 and the ring structure 124. In greater detail, the connecting portion 126 may be a conductive segment implemented with the metal layer M7, and the connecting portion 126 may couple a conductive segment in an outermost turn at a left side of the ring structure 122 to a conductive segment in an outermost turn at a right side of the ring structure 124. In some embodiments, the connecting portion 126 may be formed by extending the conductive segments in the above-mentioned two outermost turns. The connecting portion 128 may be conductive segment implemented with the redistribution layer RDL, and the connecting portion 128 may connect the conductive segment L1 of an outermost turn, which is adjacent to a central location (i.e., the reference line S-S'), in the ring structure 122 to the conductive segment L1 of an outermost turn, which is adjacent to the central location, in the ring structure 124.

The terminal P1-1 is arranged on the connecting portion 126, the terminal P1-2 is arranged on the connecting portion 128, and the terminals P1-1 and P1-2 are all located on the above central location (e.g., aligned with the reference line S-S'). In some embodiments, the terminal P1-1 may be a signal input (or output) terminal, and the terminal P1-2 may be a signal output (or input) terminal. The terminal P1-1 may be connected to the ring structure 122 through the connecting portion 126 in a first direction (e.g., the direction of –X), and is connected to the ring structure 124 through the connecting portion 126 in a second direction (e.g., the direction of +X). The first direction is the opposite of the second direction. Similarly, the terminal P1-2 is connected to the ring structure 122 through the connecting portion 128 in the first direction, and is connected to the ring structure 124 through the connecting portion 128 in the second direction. A signal received by the terminal P1-1 (or the terminal P1-2) may simultaneously flow into the ring structure 122 and the ring structure 124 in different directions, and then flow to the terminal P1-2 (or the terminal P1-1). As a result, the coil 120 may have a better impedance matching, in order to achieve better wire balancing. Moreover, the signal flowing from the terminal P1-1 is transmitted to the terminal P1-2 through the ring structure 122 in a clockwise direction, and the signal flowing from the terminal P1-1 is transmitted to the terminal P1-2 through the ring structure 124 in a counterclockwise direction. With such arrangement, a direction of a magnetic field generated from the ring structure 122 is the opposite of a direction of a magnetic field generated from the ring structure 124. As a result, the magnetic fields generated from the ring structures 122 and 124 are canceled by each other, in order to reduce noise coupling.

Figure 3:
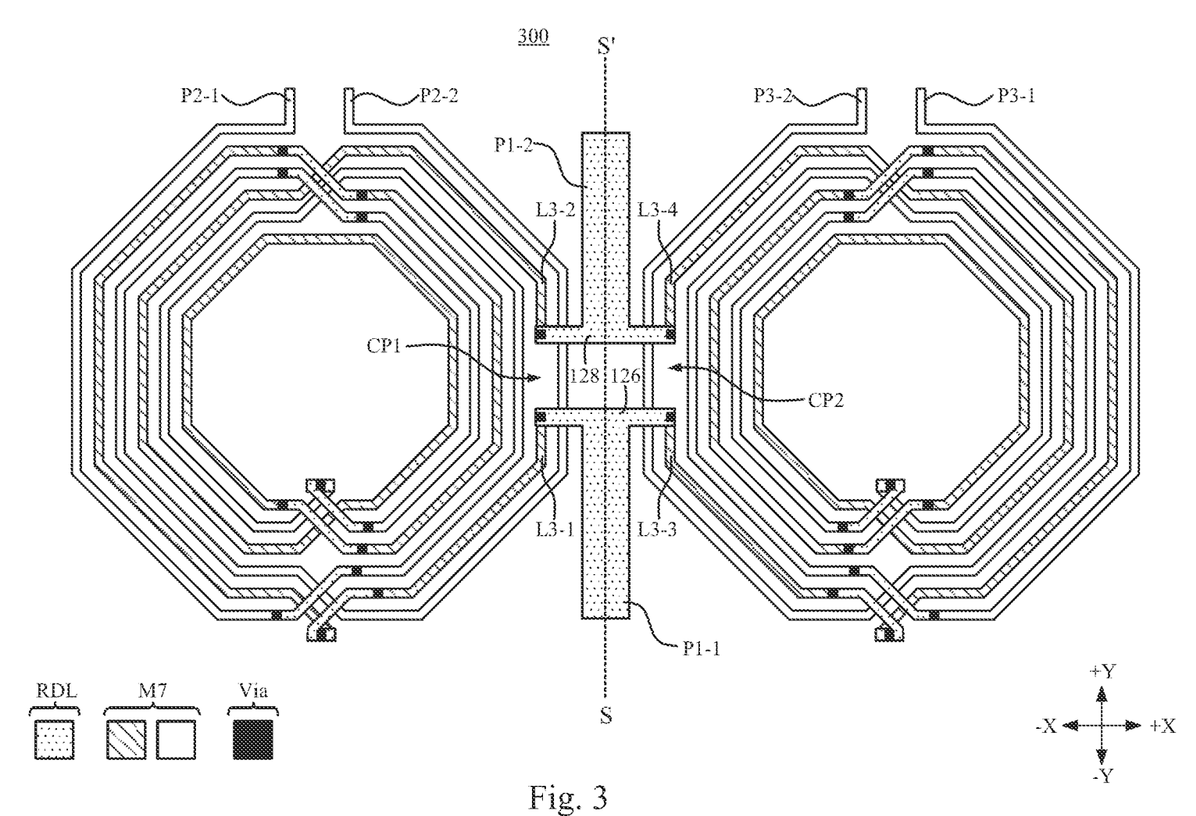
FIG. 3 is a schematic diagram of a transformer device according to some embodiments of the present disclosure.

It is understood that, the conductive segment connecting the terminal P1-2 (i.e., the connecting portion 128) may be extended outwardly for wire routing. For example, the conductive segment connecting the terminal P1-2 may be extended along the direction of –Y to be over the connecting portion 128. Alternatively, as shown in FIG. 3, the conductive segment connecting the terminal P1-2 may be extended along the direction of +Y as well. In some embodiments, one of the terminals P1-1 and P1-2 receives a single signal, and another one of the terminals P1-1 and P1-2 receives a ground voltage. In other words, the coil 120 may be applied with (but not limited to) a single-ended signaling.

The coil 140 is configured to couple the ring structure 122. As shown in FIG. 1C, the coil 140 may be a planar coil which includes conductive segments L3 (shown in white), conductive segments L4 (shown in dots), a terminal P2-1, and a terminal P2-2. In some embodiments, the conductive segments L3 may be implemented with the metal layer M7, and the conductive segments L4 may be implemented with the redistribution layer RDL. The conductive segments L3 and the conductive segments L4 form crossing structures. At least one via is arranged on each of two terminals of the conductive segment L3, in order to couple the conductive segment L3 to the conductive segment L4. The terminal P2-1 and the terminal P2-2 are respectively arranged on two terminals of the conductive segment L3 of an outermost turn in the coil 140. In some embodiments, the terminals P2-1 and P2-2 are configured to receive (or output) a set of differential signals.

The coil 160 is configured to couple the ring structure 124. In some embodiments, the coil 140 and the coil 160 are substantially mirror images of each other with respect to the reference line S-S'. As shown in FIG. 1C, the coil 160 may be a planar coil which includes conductive segments L5 (shown in white), conductive segments L6 (shown in dots), a terminal P3-1, and a terminal P3-2. In some embodiments, the conductive segments L5 may be implemented with the metal layer M7, and the conductive segments L6 may be implemented with the redistribution layer RDL. The conductive segments L5 and the conductive segments L6 form crossing structures. At least one via is arranged on each of two terminals of the conductive L6, in order to couple the conductive segment L5 to the conductive segment L6. The terminal P3-1 and the terminal P3-2 are respectively arranged on two terminals of the conductive segment L5 of an outermost turn in the coil 160. In some embodiments, the terminals P3-1 and P3-2 are configured to receive (or output) a set of differential signals.

By combining the coil 120 in FIG. 1B with the coil 140 and the coil 160 in FIG. 1C, the transformer device 100 in FIG. 1A is obtained. The coil 120 is not directly connected to the coil 140 and the coil 160. A range of the coil 140 may at least partially overlap a range of the ring structure 122, such that the coil 140 and the ring structure 122 are coupled with each other. For example, the conductive segments L3 and L4 in the coil 140 form a spiral inductor, and the spiral inductor and the ring structure 122 are arranged in an interlaced manner. In greater detail, the outermost turn of the coil 140, the outermost turn of the ring structure 122, the second turn of the coil 140, the second turn of the ring structure 122, an innermost turn of the coil 142, and an innermost turn of the ring structure 122 are sequentially arranged along a reference line R-R'. In other words, the outermost turn of the coil 140 is located outside the outermost turn of the ring structure 122 (i.e., the range of the ring structure 122 is within the range of the coil 140). As a result, the coil 140 and the ring structure 122 are coupled with each other.

Similarly, the range of the coil 160 may at least partially overlap the range of the ring structure 124, such that the coil 160 and the ring structure 124 are coupled with each other. For example, the conductive segments L5 and L6 in the coil 160 form a spiral inductor, and this spiral inductor and the ring structure 124 are arranged in an interlaced manner. In greater detail, as shown in FIG. 1A, the outermost turn of the coil 160, the outermost turn of the ring structure 124, the second turn of the coil 160, the second turn of the ring structure 124, the innermost turn of the coil 160, and the inner turn of the ring structure 124 are sequentially arranged along a reference line r-r'. In other words, the outermost turn in the coil 160 is located outside the outermost turn in the ring structure 124 (i.e., the range of the ring structure 124 is within the range of the coil 160). As a result, the coil 160 and the ring structure 124 are coupled with each other.

In the transformer device 100, the terminals P1-1 and P1-2 are arranged at a first side of the ring structure 122 (and/or the ring structure 124), and the terminals P2-1, P2-2, P3-1, and P3-2 are arranged at a second side of the ring structure 122 (and/or the ring structure 124), in which the first side is the opposite of the second side. For example, the first side may be a side of the direction of −Y (e.g., a lower side of drawings), and the second side may be a side of the direction of +Y (e.g., an upper side of drawings). The arrangements of the above terminals are given for illustrative purposes, and the present disclosure is not limited thereto. Some optional arrangements will be shown in FIG. 2 and FIG. 3.

Figure 1D:
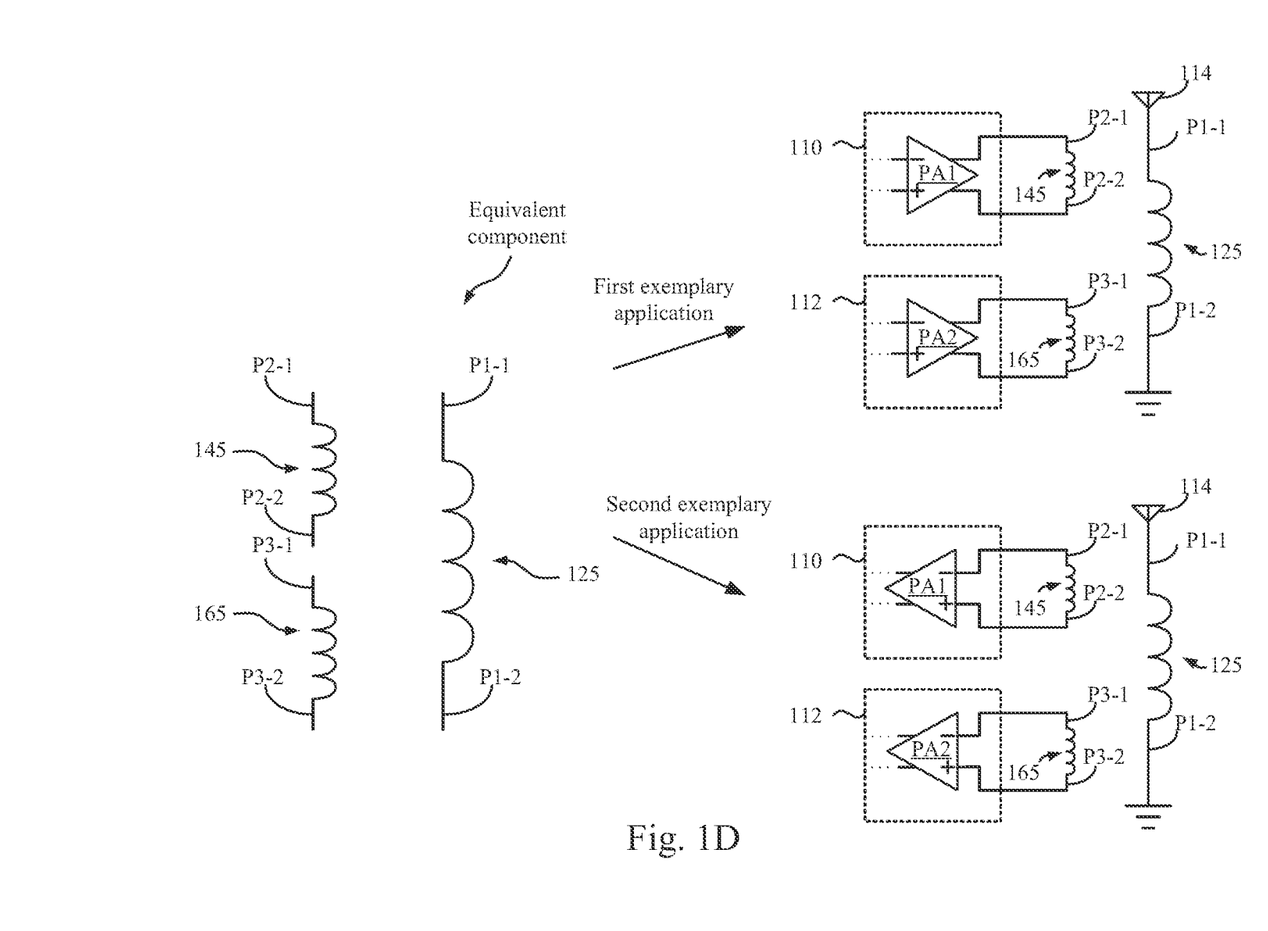
FIG. 1D is a schematic diagram illustrating an equivalent component and exemplary applications of the transformer device in FIG. 1A according to some embodiments of the present disclosure.

FIG. 1D is a schematic diagram illustrating an equivalent component and exemplary applications of the transformer device 100 in FIG. 1A according to some embodiments of the present disclosure. The transformer device 100 may be considered as the equivalent component shown in FIG. 1D, in which an inductor 125 represents the coil 120, an inductor 145 represents the coil 140, and the inductor 165 represents the coil 160. In some embodiments, signals on the inductor 145 and the inductor 165 may be coupled to the inductor 125 simultaneously, in order to operate as a power combiner. In some other embodiments, the inductor 125 may receive a signal (not shown) form the terminal P1-1 (or the terminal P1-2), and couple this signal to the inductor 145 and the inductor 165 simultaneously.

In a first exemplary application, the terminals P2-1 and P2-2 of the inductor 145 are coupled to output terminals of a differential circuit 110 to receive a set of differential signals (not shown), and the terminals P3-1 and P3-2 of the inductor 165 are coupled to output terminals of a differential circuit 112 to receive another set of differential signals (not shown). The inductor 145 and the inductor 165 may couple the received signals to the inductor 125. As a result, the inductor 125 may combine these signals to be a single signal (not shown). In this example, the differential circuit 110 may be a power amplifier PA1, the differential circuit 112 may be a power amplifier PA2, the terminal P1-1 of the inductor 125 is coupled to an antenna 114, and the terminal P1-2 of the inductor 125 is coupled to ground. As a result, the inductor 125 may transmit the single signal through the antenna 114.

In a second exemplary application, the inductor 125 receives a signal from the antenna 114, and couples this signal to the inductor 145 and the inductor 162 simultaneously. The inductor 145 converts the coupled signal to a first set of differential signals (not shown). The terminals P2-1 and P2-2 are coupled to the two input terminals of the differential circuit 110, in order to transmit the first set of differential signals to the differential circuit 110. The inductor 165 converts the coupled signal to a second set of differential signals (not shown). The terminals P3-1 and P3-2 are coupled to the two input terminals of the differential circuit 112, in order to transmit the second set of differential signals to the differential circuit 112.

Figure 1E:
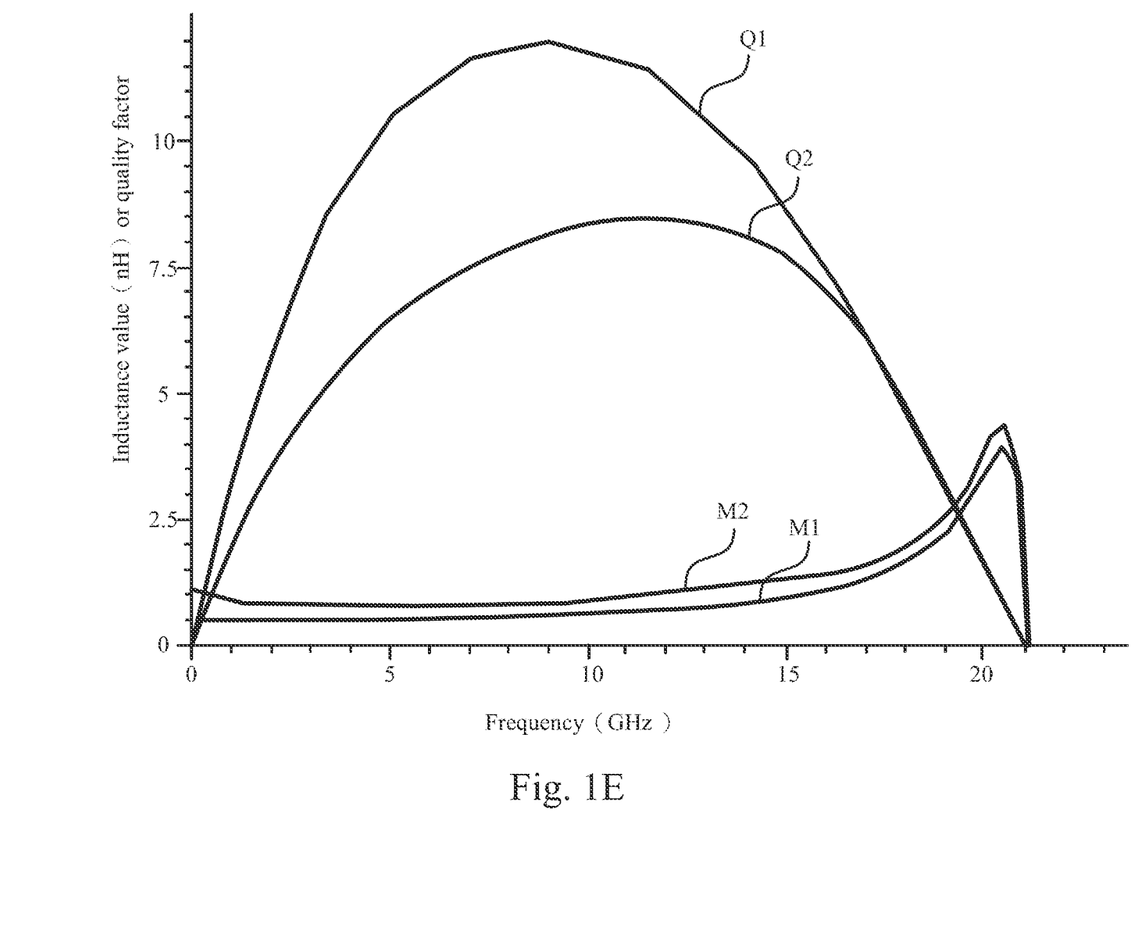
FIG. 1E is an experimental result of the transformer device in FIG. 1A according to some embodiments of the present disclosure.

FIG. 1E is an experimental result of the transformer device 100 in FIG. 1A according to some embodiments of the present disclosure. A curve Q1 corresponds to a quality factor of the coil 120, a curve Q2 corresponds to a quality factor of the coil 140 (or the coil 160), a curve M1 corresponds to an inductance value of the coil 120, and a curve M2 corresponds to an inductance value of the coil 140 (or the coil 160). The coil 120 is substantially formed with two inductors (i.e., the ring structure 122 and the ring structure 124) which are coupled in parallel. Compared with the coil 140 (or the coil 160) the coil 120 has a lower resistance and thus has higher quality factor and lower inductance value. When applying in 5 GHz applications, the inductance value of the coil 120 is about 0.5403 nH, and has the quality factor of about 10.5. The inductance value of the coil 140 (or the coil 160) is about 0.8074 nH, and has the quality factor of about 6.5. The above values are given for illustrative purposes, and the present disclosure is not limited thereto.

Figure 2:
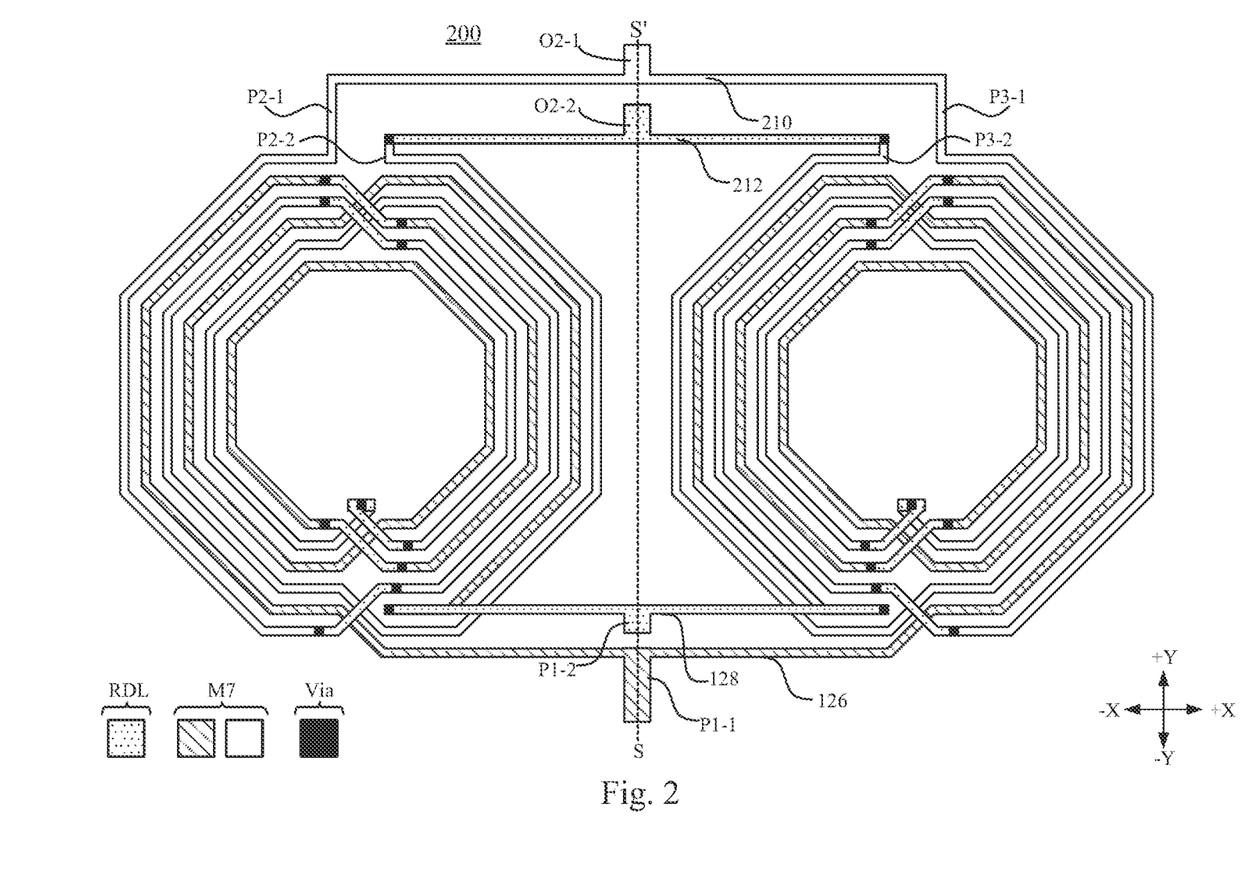
FIG. 2 is a schematic diagram of a transformer device according to some embodiments of the present disclosure.

FIG. 2 is a schematic diagram of a transformer device 200 according to some embodiments of the present disclosure. Compared with the transformer device 100, the transformer device 200 further includes a connecting portion 210, a connecting portion 220, a terminal O2-1, and a terminal O2-2. The connecting portion 210 may include a conductive segment that is implemented with the metal layer M7, and is configured to connect the terminal P2-1 to the terminal P3-1. The connecting portion 212 may include a conductive segment that is implemented with the redistribution layer RDL, and is configured to connect the terminal P2-2 to the terminal P3-2. At least one via is arranged on each of two terminals of the connecting portion 212, in order to couple the conductive segment of the outermost turn in the coil 140 to the conductive segment of the outermost turn in the coil 160.

In other words, in view of the equivalent component of the transformer device 200, the terminal P2-1 of the inductor 145 is connected to the terminal P3-1 of the inductor 165, in order to be the terminal O2-1. The terminal of the inductor 145 is connected to the terminal P3-2 of the inductor 165, in order to be the terminal O2-2. The terminal O2-1 and the terminal O2-2 are arranged on the connecting portion 210 and the connecting portion 212, respectively, and are located in the central location between the coil 120 and the coil 140 (i.e., aligned with the reference line S-S'). In this example, the coil 140 and the coil 160 are applied with single end signaling. For example, the terminal O2-1 is configured to receive a single-end signal (not shown). The received signal flows to the coil 140 and the coil 160 in different directions, and is simultaneously coupled to the ring structure 122 and the ring structure 124. The terminal O2-2 is configured to receive a ground voltage (not shown) or a common mode voltage (not shown).

FIG. 3 is a schematic diagram of a transformer device 300 according to some embodiments of the present disclosure. Compared with the transformer device 100, the terminal P1-1 and the terminal P1-2 of the transformer device 300 are extended outwardly along the direction of −Y and the direction of +Y respectively. In greater detail, the outermost turn adjacent to the central location (e.g., the location of the reference line S-S') in the ring structure 122 includes conductive segments L3-1 and L3-2, and the outermost turn adjacent to the central location in the ring structure 124 includes conductive segments L3-3 and L3-4. The terminal P1-1 is located between the conductive segments L3-1 and L3-3, and the terminal P1-2 is located between the conductive segments L3-2 and L3-4. A cutting portion CP1 is located between the conductive segments L3-1 and L3-2, and a cutting portion CP2 is between the conductive segments L3-3 and L3-4. In other words, the conductive segments L3-1 is not directly connected to the conductive segment L3-2, and the conductive segment L3-3 is not directly connected to the conductive segment L3-4. The connecting portion 126 is connected to the conductive segments L3-1 and L3-3, and is extended from the central location along the direction of −Y, in order to form the terminal P1-1. The connecting portion 128 is connected to the conductive segments L3-2 and L3-4, and is extended from the central location along the direction of +Y, in order to form the terminal P1-2.

As described above, the transformer device in some embodiments of the present disclosure utilizes three coils to implement an inductor structure having mirror symmetry. As a result, the transformer device is able to have better line balancing, in order to be applied to applications include power combining, balanced to unbalanced converting, unbalanced to balanced converting, etc.

The above implementations (e.g., number of turns, material, number of terminals, shape, etc.) and exemplary applications of the transformer devices are given for illustrative purposes only, and the present disclosure is not limited thereto. For example, shapes of the coil 120, the coil 140, and the coil 160 may be other polygon or circle. The number of turns in the coil 120, the coil 140, and the coil 160 can be adjusted according to practical requirements.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A transformer device, comprising:
 a first coil comprising a first ring structure, a second ring structure, a first connecting portion, and a first terminal, wherein the first terminal is arranged on the first connecting portion and is located at a central location between the first ring structure and the second ring structure, the first terminal is connected to the first ring structure through the first connecting portion in a first direction, and connected to the second ring structure through the first connecting portion in a second direction, and the first direction is the opposite of the second direction;
 a second coil configured to couple the first ring structure; and
 a third coil configured to couple the second ring structure, wherein the second coil and the third coil have the same structure, and the first connection portion is arranged outside both of the second coil and third coil,
 wherein the first coil further comprises a second terminal and a second connecting portion, the second terminal is arranged on the second connecting portion and is located the central location between the first ring structure and the second ring structure, the second terminal is connected to the first ring structure through the second connecting portion in the first direction, and connected to the second ring structure through the second connecting portion in the second direction, and the first connecting portion and the second connecting portion are implemented with different metal layers and extend in the same direction.

2. The transformer device of claim 1, wherein a range of the second coil at least partially overlaps a range of the first ring structure, and a range of the third coil at least partially overlaps a range of the second ring structure.

3. The transformer device of claim 1, wherein an outermost turn of the second coil is arranged outside the first ring structure, and an outermost turn of the third coil is arranged outside the second ring structure.

4. The transformer device of claim 1, wherein the first ring structure and the second ring structure are substantially mirror images of each other.

5. The transformer device of claim 1, wherein the second coil comprises a plurality of first conductive segments and a plurality of second conductive segments, and the first conductive segments are connected to the second conductive segments to form a spiral inductor.

6. The transformer device of claim 5, wherein the first ring structure and the spiral inductor are arranged in an interlaced manner.

7. The transformer device of claim 5, wherein the plurality of first conductive segments are implemented with a first metal layer, the plurality of second conductive segments are implemented with a second metal layer, and the first metal layer is different from the second metal layer.

8. The transformer device of claim 1, wherein the second coil comprise a plurality of third terminals, the first terminal is arranged at a first side of the first ring structure, and the plurality of third terminals are arranged at a second side opposite to the first side.

9. The transformer device of claim 8, wherein the plurality of third terminals are configured to receive or output a set of differential signals.

10. The transformer device of claim 1, wherein a direction of a magnetic field generated from the first ring structure is the opposite of a direction of a magnetic field generated from the second ring structure.

11. The transformer device of claim 1, wherein an outermost turn adjacent to the central location in the first ring structure comprises a first conductive segment and a second conductive segment, an outermost turn adjacent to the central location in the second ring structure comprises a third conductive segment and a fourth conductive segment, the first terminal is arranged between the first conductive segment and the third conductive segment, the second terminal is arranged on the second connecting portion and located between the second conductive segment and the fourth conductive segment, and the second connecting portion connects the second conductive segment to the fourth conductive segment.

12. The transformer device of claim 1, wherein the second coil comprises a plurality of third terminals, the third coil comprises a plurality of fourth terminals, a first one of the plurality of third terminals is coupled to a first one of the plurality of fourth terminals, and a second one of the plurality of third terminals is coupled to a second one of the plurality of fourth terminals.

13. The transformer device of claim 1, wherein each of the first coil, the second coil, and the third coil is a planar coil.

14. The transformer device of claim 1, wherein the first coil is configured to receive a signal from the first terminal, and to couple the signal to the second coil and the third coil simultaneously.

15. The transformer device of claim 14, wherein the signal is transmitted through the first ring structure in a clockwise direction, and the signal is transmitted through the second ring structure in a counterclockwise direction.

16. The transformer device of claim 1, wherein the second coil is a mirror image of the third coil.

17. The transformer device of claim 1, wherein the first terminal is coupled to an antenna, and the second terminal is coupled to ground.

18. The transformer device of claim 1, wherein the second coil is coupled to a first differential circuit, and the third coil is coupled to a second differential circuit.

19. The transformer device of claim 18, wherein each of the first differential circuit and the second differential circuit is a power amplifier.

* * * * *